United States Patent [19]

Hieber et al.

[11] Patent Number: 4,592,921

[45] Date of Patent: Jun. 3, 1986

[54] METHOD FOR MONITORING AND REGULATING THE COMPOSITION AND THE LAYER THICKNESS OF METALLICALLY CONDUCTIVE ALLOY LAYERS DURING THEIR MANUFACTURE

[75] Inventors: Konrad Hieber, Bernau; Norbert Mayer, Munich, both of Fed. Rep. of Germany

[73] Assignee: Siemens Aktiengesellschaft, Berlin & Munich, Fed. Rep. of Germany

[21] Appl. No.: 688,364

[22] Filed: Jan. 2, 1985

[30] Foreign Application Priority Data

Feb. 16, 1984 [DE] Fed. Rep. of Germany ....... 3405559

[51] Int. Cl.$^4$ .............................................. B05D 3/12
[52] U.S. Cl. ......................................... 427/9; 427/10; 427/240; 427/241
[58] Field of Search ................... 427/9, 10, 240, 241; 118/712, 688, 665, 677

[56] References Cited

U.S. PATENT DOCUMENTS

| 3,781,089 | 12/1973 | Fay et al. ........................ | 427/10 X |
| 3,995,073 | 11/1976 | Kuonen et al. .................... | 427/10 |
| 4,276,324 | 6/1981 | Pöhler et al. ..................... | 427/10 |
| 4,331,702 | 5/1982 | Hieber et al. ..................... | 427/10 |

OTHER PUBLICATIONS

IBM Technical Disclosure Bulletin, vol. 9, No. 3, pp. 247–248 (Aug. 1966).
"A Method for the Continuous Measurement of Thickness and Deposition Rate of Conducting Films During a Vacuum Evaporation", by Turner et al., J. Sci. Instrum., 1963, vol. 40, pp. 557–561.
"Resistance Measurements by Radio Telemetric System During Film Deposition by Sputtering", by Mayer, Siemens Forsch.-u. Entwickl.-Ber. Bd. 11 (1982), No. 6, Springer-Verlag 1982, pp. 322–326.
"Radio-Frequency Sputter Deposition of Alloy Films", by K. Hieber, Siemens Forsch.-u.Entwickl.--Ber. Bd. 11 (1982), No. 3, Springer-Verlag 1982, pp. 145–148.
"An Overview of Thickness Measurement Techniques for Metallic Thin Films", by Sheldon C. P. Lim et al., Solid State Technology, Feb. 1983, pp. 99–103.

Primary Examiner—Thurman K. Page
Attorney, Agent, or Firm—Hill, Van Santen, Steadman & Simpson

[57] ABSTRACT

A method for monitoring and regulating composition and layer thickness of metallically conductive alloy layers during their manufacture by means of electrical resistance measurement. Individual alloy components are cyclically applied in coats in chronological succession. By comparison of measured actual values of the layer resistance $R_G$ after the application of each and every individual coating to rated values determined before the layer manufacture, the coating rates of the corresponding alloy component sources are controlled. The method serves for the reproducible manufacture of thin metal layers in semiconductor technology and allows the control of composition and layer thickness even during manufacture of said layers.

11 Claims, 4 Drawing Figures

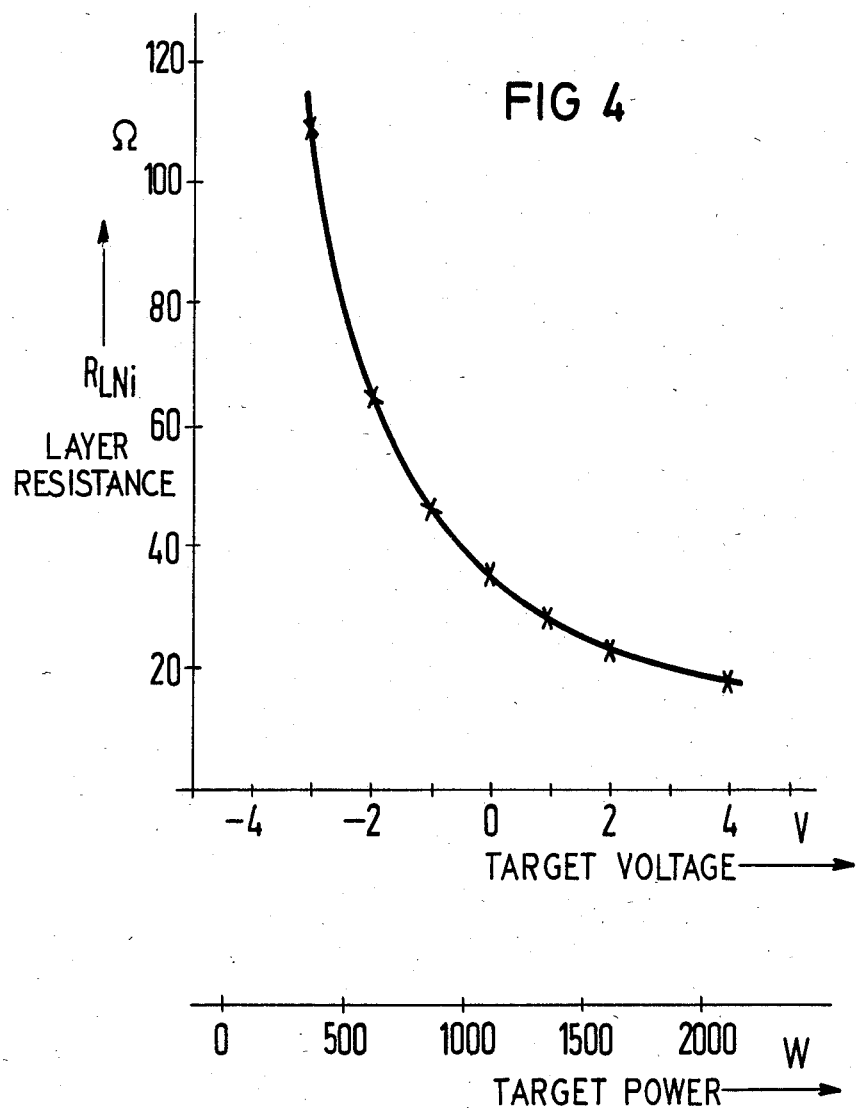

METHOD FOR MONITORING AND REGULATING THE COMPOSITION AND THE LAYER THICKNESS OF METALLICALLY CONDUCTIVE ALLOY LAYERS DURING THEIR MANUFACTURE

BACKGROUND OF THE INVENTION

The present invention relates to a method for monitoring and regulating composition and layer thickness of metallically conductive alloy layers during their manufacture by means of electrical resistance measurement, whereby the individual alloying components are cyclically deposited layer-wise in chronological succession.

The exact knowledge of the composition and the thickness of layers which are produced by means of vapor-deposition or sputtering, for example by means of simultaneous sputtering of two or more targets ("co-sputtering"), is of great significance for the fabrication of thin film circuits or integrated circuits.

Whereas the composition has an extremely sensitive influence on the electrical and metallurgic properties (for example, diffusion, reaction, etc.), knowledge of the thickness is also essential given layers which are employed, for example, as resistance or etching stops. In the course of continuing miniaturization in semiconductor technology, the tolerances with respect to composition and thickness have become very tight, so that a measurement and control of these two values is already indispensable during the layer production in order to obtain a sufficiently high yield.

Given chrome-nickel thin film resistors, the temperature coefficient of the electrical resistance, which must lie, for example, in the range from $-25°$ through $+25° \times 10^{-6°}/K$. is very sensitively influenced by the composition. In order to be able to reproducibly observe these values, the concentration may only fluctuate by $\pm 3\%$ atomic number part. Since, moreover, a high stability is also demanded of this material which in turn depends on the quantity of oxygen incorporated into the layer, the oxygen concentration must also be controlled.

Finally, a resistance structure with a narrow tolerance value of resistance is generated from the layer which is deposited in surface-wide fashion, and which is generated by means of a photo etching process. The fluctuations in layer thickness must therefore lie below $\pm 3\%$.

Given tantalum-silicon layers employed in VLSI technology as low-resistance gate material or as interconnects, the specific electrical resistance is highly influenced by the composition. Furthermore, only layers having a specific concentration have the property of forming a protective $SiO_2$ layer in an oxidizing atmosphere at temperatures around 900° C. In this case, too, a reproducible oxide growth is only obtained when the composition fluctuates only slightly ($\pm 2\%$ atomic number part) around a fixed value.

In order to obtain homogeneous layers with respect to layer thickness and composition, it is known to move the substrates provided for the coating during coating (for example, rotation, planetary movement). Since modern coating systems frequently comprise a lock via which the substrates are introduced into the actual coating chamber, the substrate is not stationary. This greatly complicates an in-place identification of the layer thickness or of the composition. One possibility of determining the layer thickness is to measure the resistance at a stationary substrate which is provided with electrical contacts and is coated at the same time as the other, moved substrates. Reference is made in this regard to an article by S. C. P. Lim and D. Ridley in Solid State Technology, February 1983, pages 99 through 103 and to an article by I. A. Turner et al in J. Sci. Instrum., Vol. 40, pages 557 through 561, both incorporated herein by reference.

A further method consists of installing one or more stationary crystal oscillators in the system, the resonant frequency of said oscillators changing in a defined fashion with increasing weight per unit area due to a vapor-deposited or sputtered material.

The disadvantage of these methods is that a calibration must be carried out due to the different topical positions between substrate and oscillator or reference substrate, respectively.

When, for example, one wishes to control the composition of a binary alloy layer with the assistance of crystal oscillators, then it must be guaranteed that at least two oscillatory crystals are mounted in the system, whereby each oscillator is coated by only one source. Conclusions can be drawn regarding the composition of the layer from the ratio of the momentary weight per unit area.

A further, very exact possibility of regulating the layer composition is to utilize a mass spectrometer, given which the material deriving from the two vaporizer sources proceeds into the ion source and is registered. Here, too, there is the disadvantage that the ion source is stationary and that an oscillatory crystal is required for the identification of the layer thickness. Furthermore, this method cannot be applied given sputtering systems, or is too imprecise since the deposition occurs at an argon pressure of about $10^{-2}$ mbar.

SUMMARY OF THE INVENTION

An object of the invention is to specify a method for the manufacture of alloy layers wherein the alloy components or pre-alloys are not continuously applied to the substrate but in chronological succession, i.e. layer-wise, which allows the alloy composition and the overall layer thickness to be defined during coating, allows changes in the alloy composition to be still performed during the layer production process, and modifies the rates of the individual material sources in accordance with the identified changes such that the desired alloy composition or final layer thickness is again achieved. A further object is to apply this method to the manufacture of layers whose concentration changes continuously or discontinuously with the layer thickness and to the manufacture of alloy layers having defined intermediate layers.

This object is achieved by means of a method of the type initially cited wherein:

(a) the layer resistance before and after the deposition of every individual layer (A,B) is measured and the layer resistance or the ratio of the layer resistances of layers comprising different material is defined as an actual value;

(b) the layer resistance is compared to the value of the layer resistance or the ratio of the layer resistances fixed before the layer manufacture as a rated value; and (c) given differences between rated and actual values, the coating rates of the corresponding alloy component sources (A,B) are modified until the actual values coincide with the rated values.

The method of the invention is to regulate or control the individual coating sources, whereby the actual values of the controlled variable (either layer resistance or the ratio of layer resistances of the individual layers of different material) is continuously identified (measured), is compared to the fixed values of the layer resistances (such as rated value, manipulated variable), and the rates of the coating source (as the manipulated variable) is adjusted given such differences of rated and actual value, so that the values of the controlled variable are matched to the values of the manipulated variable.

When a value varying steadily or unsteadily from layer to layer is employed as the manipulated variable, it is possible to produce alloy layers having a composition varying continuously or discontinuously over the layer thickness.

When the layer composition is only to be monitored, only the above-described actual values of the controlled variables are acquired during the layer manufacture. A regulation then does not occur. After the layer production, the layer is already known without further investigation, and whether, specifically, the manufactured layer has the desired electrical properties. This method of monitoring, restricted in comparison to regulation, is already of great significance for production since, when manufacturing a semiconductor component, a plurality of following steps can be omitted when it is already known after the coating that the applied metallic layer is not "good".

BRIEF DESCRIPTION OF THE DRAWINGS

FIG. 4 is the interrelationship between target power or control voltage and layer resistance for nickel, as shown in a curve diagram.

DESCRIPTION OF THE PREFERRED EMBODIMENTS

Figure 1:
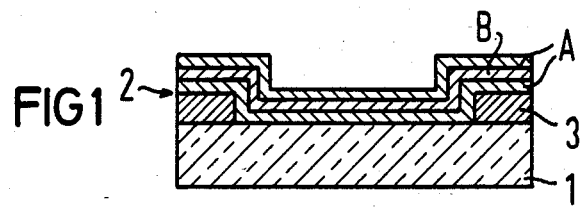
FIG. 1 shows the structure of a multilayer coating on an electrically insulating substrate with contacts.

As shown in FIG. 1, given the alloy layers for the method of the invention, the individual alloy components or partners (pre-alloys) are alternately applied. For example, given a binary alloy AB, the two alloy partners A and B are applied from separate sources (for example targets) to the substrate 1 such that the layer 2 first consists of a plurality of layers A,B,A,B . . . , etc. A and B can be the pure elements, for example Cr and Ni, or can also be pre-alloys, for example Al/Si=A and Ti=B, for the manufacture of Al/Si/Ti interconnects, or Ta/Si=A and Ta=B for the production of TaSi$_2$ gate materials or interconnects. The electrical contact is referenced 3.

The manufacture can occur such that the two material sources are locationally separated and the substrate is conducted past both sources at periodic time intervals, such as is disclosed, for example, in an article by K. Hieber in Siemens Forsch. und Entw. Ber., Vol. 11 (1982), No. 3, pages 145 through 148, incorporated herein by reference. Another possibility exists given vaporization with an electron beam. The beam oscillates between two material sources, whereby the dwell time at a material can be used to influence the layer thickness and thus the layer composition. A furhter possibility is to alternately cover the material sources by means of a diaphragm. In order to be able to generate a homogeneous material by means of tempering, it is recommended to select as low as possible a layer thickness (for example, 1 through 150 nm, preferably below 50 nm).

Figure 2:
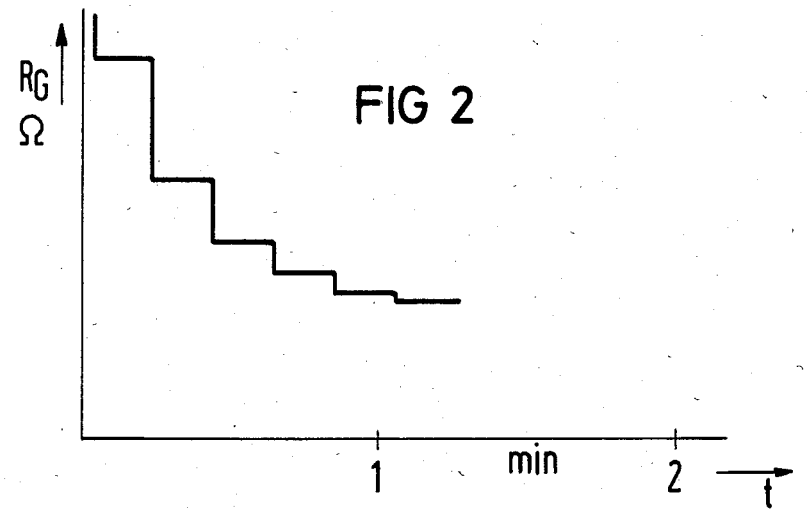
FIG. 2 shows the curve of the overall resistance $R_G$ given application of a multilayer coating as a function of time t.

As shown in FIG. 2, when, given the described coating methods, the resistance on the substrate is continuously measured during the layer production, then one obtains a step-shaped resistance curve, since every coating A or B lowers the momentary overall resistance by a discrete amount. This step-shaped sequence of measured values can be quickly and continuously analyzed with the assistance of a computer in order to define the resistance reduction due to the individual coating. Another possibility is to execute a measurement of the electrical layer resistance before and after the passage of the layer under the coating source, whereby the point in time for the individual measurements is externally defined, for example by the position of the pallet with reference to a relay, such that the specimen is just situated outside of the coating region.

The resistance of a coating can be calculated from the change in resistance from stage to stage, said coating resistance, except for the first coating, assuming a fixed value given constant manufacturing conditions.

Figure 3:
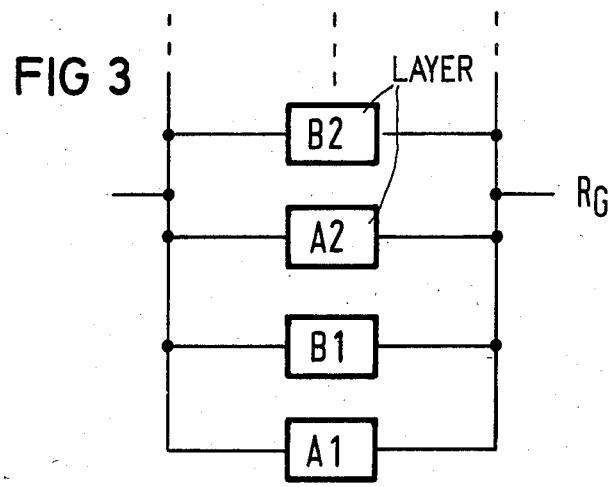
FIG. 3 is an equivalent circuit diagram for a multilayer coating having the layer sequence A,B,A,B, . . .

As shown in FIG. 3, this layer sequence can be electrically represented by a series of parallel connections of resistors, whereby one resistor corresponds to the resistance $R_{Ln}$ of one coating.

For that case in which a material is produced, for example, from two coating sources (A,B), the overall resistance $R_G$ is calculated according to the equation:

$$\frac{1}{R_{Gn,m}} = \frac{1}{R_{A1}} + \frac{1}{R_{B1}} + \frac{1}{R_{A2}} + \frac{1}{R_{B2}} + \ldots \quad\quad \text{I}$$
$$+ \frac{1}{R_{Am}} + \frac{1}{R_{Bm}} + \frac{1}{R_{An}} + \frac{1}{R_{Bn}} + \ldots$$

Given layers having a constant concentration dependent on the layer thickness, the resistances of the coatings of material A and material B are the same, i.e. $R_{A1}=R_{A2}=R_{An}=R_A$ or $R_{B1}=R_{B2}=R_{Bn}=R_B$.

When the momentary overall resistance has one more coating of material A, then, given the precondition that A is also the first coating, the following is true:

$$R_{Gn,m} = \frac{R_A \cdot R_B}{nR_B + mR_A} \text{ with } m = n - 1 \quad\quad \text{II}$$

Given the same number of coatings of material A and B, then the following applies:

$$R_{Gm,m} = \frac{R_A \cdot R_B}{m(R_A + R_B)} \quad\quad \text{III}$$

The coating resistance is calculated from the difference of two successive overall resistances, whereby $$R_{LAn} = \frac{R_{Gm,m} \cdot R_{Gn,m}}{R_{Gm,m} - R_{Gn,m}} \quad\quad \text{IV}$$

applies for the coating resistance of an $n^{th}$ coating of material A according to equations I and II.

Resulting from the equations I, II and III for the coating resistance of an $n^{th}$ coating of material B is $$R_{LBn} = \frac{R_{Gn,n} \cdot R_{Gn,m}}{R_{Gn,m} - R_{Gn,n}}. \qquad \text{IV}$$

The relationship between resistance R and layer thickness d is given by the fundamental equation $$R = \frac{\rho \cdot G}{d} \qquad \text{V}$$

where $\rho$ denotes the specific electrical resistance and the geometry factor G of the layer indicates the ratio length l to width b. Assumed in the following is that l=b, and thus G=1. The thickness of a coating A thus derives from $$d_{LAn} = \rho_A / R_{LAn} \qquad \text{VI}$$

$\rho_A$ = specific electrical resistance of the coating A; and analogously applying to coating B is $$d_{LBn} = \rho_B / R_{LBn}. \qquad \text{VII}$$

The momentary overall layer thickness then results from the sum of all $d_{LA}$ and $d_{LB}$.

It follows therefrom that every discrete reduction of the overall resistance can have a specific layer thickness of the coating A or B allocated to it, since $\rho_A$ or $\rho_B$ do not depend on the number of coatings. The values for $\rho_A$ or $\rho_B$ (components or pre-alloys) are best identified in preliminary tests with only one coating source given the desired manufacturing conditions for the corresponding layer thickness. Details may be derived from an article by N. Mayer in Siemens Forschungs- und Entwicklungsberichte, Vol. 11 (1982) No. 6, pages 322 through 325, incorporated herein by reference.

Since the thickness of a coating can, in turn, have a certain amount of substance A or B allocated to it, the ratio of two successive coating resistances $R_{LAn}/R_{LBn}$ is proportional to the momentary layer composition $M_{Bn}/M_{An}$ = concentration $Z_n$.

$$M_{An} = d_{LAn} \cdot l \cdot b \cdot \gamma_A$$

$\gamma_A$ = density of the material A in g/cm³
Correspondingly valid is $$M_{Bn} = d_{LBn} \cdot l \cdot b \cdot \gamma_B,$$

where
$\gamma_B$ = density of the material B in g/cm³.

The momentary composition $Z_n$ as a mass ratio—with l=b=1—is then $$Z_n = \frac{d_{LBn} \cdot \gamma_B}{d_{LAn} \cdot \gamma_A}.$$

When $\gamma_B/\gamma_A = P_0$ is set, then the following is true:

$$Z_n = P_0 \frac{d_{LBn}}{d_{LAn}}$$

In equations VI and VII, the following applies:

$$Z_n = P_0 \frac{\rho_B R_{LAn}}{\rho_A R_{LBn}} P_1 = P_0 \frac{\rho_B}{\rho_A} \quad Z_n = P_1 \frac{R_{LAn}}{R_{LBn}}. \qquad \text{VIII}$$

Since $P_1$ is composed of constant values which can either be identified in preliminary tests ($\rho_A$, $\rho_B$) or can be taken from materials tables ($\gamma_A$, $\gamma_B$) and thus is known, the momentarily applied layer composition can be quantitatively defined from VIII during the layer production from the ratio of the coating resistances.

If, however, only changes in the layer composition are to be identified during manufacture, it is sufficient to identify the ratio of the coating resistance and to compare the values to one another or to prescribed rated values, since the proportionality factors are constant material values as long as the manufacturing conditions are constant, the latter being a prerequisite. Changes in the manufacturing conditions due to influences of foreign gases can be monitored, in particular, by means of a mass spectrometer.

When, for example, the coating rate for a material changes, then the corresponding coating resistance will become lower or higher dependent upon whether, for example, the power at the vaporizer or sputtering source has increased or decreased. Correspondingly, $R_{LA}$ and/or $R_{LB}$, or the ratio $R_{LA}/R_{LB}$, becomes greater or smaller (=actual values).

It suffices for monitoring the layer composition or overall layer thickness to continuously identify these actual values. The change of the individual coating resistances or of the ratio $R_{LA}/R_{LB}$ can be employed for a regulation in such fashion that alloy layers with constant overall composition and layer thickness can be reproducibly manufactured, this being of basic significance for any production.

There are two possibilities for the regulation:

(a) Which coating source must be regulated and whether the rate must be increased or lowered is perceived via the change of a coating resistance of the $n^{th}$ coating. The corresponding coating source is then varied such that for a pass of the layer (given two coating sources, this would be the coating n+1) the lacking material is additionally applied when too little material has been previously applied or correspondingly less material is applied in the new coating when too much material had been previously applied. In other words, the material balancing occurs such that, given the case of two coating sources, the material balancing for the $n^{th}$ layer occurs at the n+1$^{st}$ layer.

The relationship between change of the applied coating resistance ($\triangleq$ coating thickness) or concentration change, and change of the power at the corresponding coating source required for the regulation, must be determined in preliminary tests.

When the application of the altered coating has occurred as desired, and this is checked by the identification of the actual value, the coating source is again set such that the momentary layer concentration again corresponds to the desired layer concentration, this being the case beginning with the n+2$^{nd}$ coating given two coating sources.

When, by contrast, the application of the modified coating has not occurred as desired, then a material balancing is also executed given the following coating or coatings. The material balancing occurs by means of changing the coating rate of the material source to be regulated, this preferably occurring by means of varying the power of the energy supply of this material source.

This method of regulation has the advantage that, in addition to the desired effect of constant overall composition, the overall layer thickness also remains constant. The inhomogeneities due to the different coating thicknesses of individual sub-layers are compensated by the material diffusion in the later tempering of the layers for the purpose of homogenization.

(b) A second type of regulation is that the momentary layer concentration which is applied always corresponds to the desired overall concentration. Given differences between rated and actual values, the power of the initially constant coating source is adapted to the power of the changing coating source such that the momentary composition is always identical to the overall composition. Since the coating thicknesses thereby vary, a decision must be made toward the end of the coating process on the basis of the overall resistance as to whether the total number of layers must be selected greater or smaller in order to obtain a specific overall resistance or overall thickness. In contrast to the first type of regulation, no immediate balancing of too much or too little applied material occurs.

These techniques for regulating the layer composition also permit layers having variable concentration to be produced instead of enabling the goal of achieving a constant, homogeneous layer composition:

(a) It is possible to produce continuous changes of the layer composition via the thickness. The coating resistances $R_{LA}$ or $R_{LB}$ are thus no longer constant but are a function of the number n of coatings, i.e., for example, $R_{LAm} \neq R_{LAn}$ given two coating sources. The individual coating resistances or their variation must be prescribed. The power at the individual coating sources is then reset from coating to coating, partially upon consideration of the measured and identified material excess or deficit of the preceeding coating, in the manner already described above. Concentration gradients in alloy layers are excellently suited in order, for example, to achieve a better adhesion to the substrate material or in order, for example, to enable an easier formation of passivation layers at the layer surface. For example, given Cr/Ni layers, a high-chrome starting layer is desirable for improving adhesion, whereas a high-silicon final layer given $TaSi_2$ layers promotes the formation of an $SiO_2$ passivation layer.

(b) It is also possible to produce by design discontinuous changes of the layer composition such as, for example, for intermediate layers. In this case, for example, the layer is produced of only one material up to the $n^{th}$ coating. Beginning with the $n+1^{st}$ layer, the other coating source is additionally connected with a constant value. The regulation occurs as described above.

All solutions and applications disclosed up to now are particularly suited for those instances in which no diffusion of the materials into one another occurs.

In the case of diffusions of the sub-layers into one another even during the application of the coatings, step-like decreases of the resistance can still be measured, these, however, no longer exhibiting such sharp contours. In this case, the individual coating resistances can no longer be so exactly defined, so that it is more favorable to measure the resistance immediately before and after the application of a coating and to employ the difference for the calculation of the coating resistance. The momentary layer concentration can thus in fact no longer be quantitatively identified from the ratio of the coating resistances, since $\rho_{Ln}$, due to the diffusion, is no longer determined solely by the material of one coating source. Since, however, $\rho_{Ln}$ of the corresponding sub-layers is constant, the ratio of the coating resistances can again be employed in order to identify changes in the momentary layer composition, so that the above-described regulating methods are again applicable in order to realize the described applications.

When an alloy layer is to be produced whereby one component is a semiconductor material, for example silicon, then the above-described methods can be employed directly or in modified form. This is the case given the manufacture of metal silicides, for example as gate material (Ta-Si, W-Si, Ti-Si, Mo-Si, Pd-Si, etc.). The metal is thus eroded from the one coating source and the silicon from the other, so that the layer consists of a plurality of metal/semiconductor coatings. Since metal/semiconductor combinations already diffuse relatively quickly into one another during manufacture, a curve for the overall resistance which comprises discrete resistance changes is also obtained in this case. It is also possible in this case to identify changes in the momentary layer composition, to vary the rates at the corresponding material sources given changes, and thus to regulate the layer composition.

The application of the described regulating methods is also useful for manufacturing layers having continuous and discontinuous concentration changes.

A further solution—whereby the described regulating possibilities can be directly transferred—is that of employing a pre-alloy of metal/semiconductor, whereby the composition of the pre-alloy comprises a higher portion of semiconductor material than in the desired layer. The deficit in the metal component is compensated by the second material source which, for example, is formed of pure metal, whereby the metal is embedded in such a layer thickness that the double coating AB has the desired composition. In the case of manufacturing $TaSi_2$ layers, for example, a pre-alloy of Ta-Si having a mass proportion of 20% Ta in the Si would have a specific electrical resistance of about 700 $\mu\Omega cm$. Together with pure tantalum as component B ($\rho_{Ta} \approx 250 \, \mu\Omega cm$), this material as, for example, component A, would be excellently suited for reproducibly generating $TaSi_2$ layers, since a clean, step-shaped resistance reduction results given a coating-wise application of the materials.

The above has been predicated on the fact that each material source has a separate power regulation with power supply, so that the rate at each material source is adjustable independently of the other.

It is a special case when, given employment for example of two coating sources, both together have a shared power supply and the power is divided to the two coating sources via a "divider". Given "co-sputtering" whereby the targets are eroded by means of dc vaporization, the voltage is divided to the targets in accordance with the desired alloy composition proceeding from a common dc voltage source and via, for example, a potentiometer whose value can be exactly defined.

Given radiofrequency diode sputtering (rf-sputtering), only one radiofrequency generator is likewise employed, whereby the power division occurs via a control capacitor and coil. In these cases, the rates of the individual coating sources can be regulated via the overall rate and the power division, i.e. when the rate of one coating source is increased, the rate of the other coating source is diminished and vice versa. Given a change of the overall rate, the power division remains constant, i.e. the concentration ratio remains constant.

This type of energy supply for the coating sources is preferably to be employed when the resistance change produced by one type of material (for example, silicon) is so small that a direct control of this material source would be very imprecise.

In the case of "coupled" coating sources, it is then the preferred goal of the regulation to always maintain the desired layer concentration insofar as possible. For example, given a metal/semiconductor combination: only the coating resistance of the metal layer is employed for the regulation of the layer thickness, this coating resistance being regulatable by means of controlling the power emission of the shared power supply to its rated value. The composition remains uninfluenced given this type of regulation. The coating resistance produced by the semiconductor is of subordinate significance for the regulation.

ILLUSTRATIVE EMBODIMENTS

The electrical resistance measurements are executed during the layer production with an "in situ resistance measuring apparatus" such as disclosed in Siemens Forschungs- und Entwicklungsberichte, Vol. 11 (1982), pages 322 through 326 and in the European patent application No. 0 067 432 A1, both incorporated by reference. The layer production occurs in a sputtering system formed of a Randex type 4400 by means of so-called "co-sputtering" of two targets such as described, for example, in Siemens Forschungs- und Entwicklungsberichte, Volume 11 (1982), pages 145 through 148, incorporated herein by reference. During the coating, the reference substrate as well as the remaining substrates are rotated past and beneath the targets. The electrical resistance values are transmitted in wireless fashion out of the sputtering system to a receiver and are accepted by a computer MINC 23 of Digital Equipment. The influence of the sputter plasma on the layer is taken into consideration in the measurement of the layer resistance. A reed relay is mounted to the shaft of the rotary plate, so that the computer always accepts the resistance values at fixed locations: before and after the first target, and before and after the second target. The computer can determine the coating resistances $R_{Ln}$ and the ratios $R_{Ln}/R_{Lm}$ therefrom. For the regulation or control of the power of the target (rate of application), the computer outputs control voltages between $-5$ and $+5$ V via two digital-to-analog converters with which the power supply of the targets can be individually varied or, in the case of coupled targets, with which the overall power and the power division can be varied. The coating resistance, and thus $\rho_L$ for each individual material, is defined in preliminary tests, and always under the manufacturing conditions occurring later (test with only one target). Furthermore, the relationship between changes of the applied coating resistance and the $\pm 5$ V control voltages ($\hat{=}$ change of the power at the target $\hat{=}$ change of the sputter rate) is defined.

Illustrative Embodiment 1

Cr-Ni Alloy Layers

The monitoring and regulation shall be explained in greater detail below with reference to the manufacture of a Cr-Ni resistance layer. The layers are deposited by means of so-called co-sputtering, whereby the speed amounts to 1 rpm. The desired composition should amount to $M_{Cr}/M_{Ni}=47/53\%$ (mass proportion).

When the density values for Cr and Ni are taken from the known literature, then $$d_{Cr}/d_{Ni} = M_{Cr}/M_{Ni} \cdot \frac{\gamma_{Ni}}{\gamma_{Cr}} \quad \gamma_{Ni} = 8.9 \text{ g/cm}^3$$

$$d_{Cr}/d_{Ni} = 0.887 \cdot 1.24 = 1.1 \quad \gamma_{Cr} = 7.19 \text{ g/cm}^3$$

results for the layer thickness ratio.

In the present example, an ideal coating thickness of 5 nm was desired for Cr and an ideal coating thickness of 4.5 nm was desired for Ni.

The overall thickness of the finished layer should have the value 47.5 nm. The specific electrical resistances for Cr and Ni of the corresponding coating thickness identified from preliminary tests amounts to $\rho_{Cr}=56.7$ $\mu\Omega$cm and $\rho_{Ni}=16.2$ $\mu\Omega$cm. Disregarding diffusion or reaction effects, the coating resistances (given quadratic area) are calculated therefrom at $R_{LCr}=113.4\Omega$ and $R_{LNi}=36\Omega$ (rated values) or $R_{LCr}/R_{LNi}=V_{Ln}=3.15$. Cr was applied as the first coating due to the better adhesion of Cr to oxidized substrates. The measured values of the overall resistance are listed in Table I for the ideal case. The measuring precision for the measuring ranges $0-1\Omega$, $0-10\Omega$, $0-100\Omega$, $0-1000\Omega$ and $0-10,000\Omega$ respectively amounts to $\pm 0.1\%$.

The interrelationship between mass ratio (i.e. concentration) and ratio of the coating resistances can be established via the equations $$d_{Cr}/d_{Ni} = \rho_{Cr}/\rho_{Ni} \cdot R_{LNi}/R_{LCr} = 3.5 \cdot \frac{1}{V_{Ln}} \text{ with } V_{Ln} = \frac{R_{LCr}}{R_{LNi}}$$

and $$d_{Cr}/d_{Ni} = M_{Cr}/M_{Ni} \cdot \gamma_{Ni}/\gamma_{Cr} = 1.24 \, M_{Cr}/M_{Ni}$$
i.e., $$M_{Cr}/M_{Ni} = \frac{3.5}{1.24 \cdot V_{Ln}}$$

The mass proportion in % of, for example, chrome then results from the ratio $M_{Cr}/M_{Ni}$ and from the fact that the sum $M_{Cr}+M_{Ni}=100\%$ is valid.

Example for Monitoring:

TABLE I

Overall Resistance as a Function of the Number of applied Cr or Ni coatings, Respectively.

| Coat | Overall Resistance given quadratic area in $\Omega$ before | after | Actual Value Coating resistance $R_{Ln}$ in $\Omega$ | Ratio of the coating resistances $V_{Ln}$ | Momentary concentration in Mass % Cr |
|---|---|---|---|---|---|
| Cr 1 | — | 113.9 | 113.9 | 3.16 | 47.17 |
| Ni 1 | 113.9 | 27.4 | 36.08 | | |
| Cr 2 | 27.4 | 22.0 | 111.63 | 3.19 | 46.95 |
| Ni 2 | 22.0 | 13.5 | 34.94 | | |
| Cr 3 | 13.5 | 12.2 | 126.69 | 3.53 | 44.40 |
| Ni 3 | 12.2 | 9.10 | 35.81 | | |
| Cr 4 | 9.10 | 8.42 | 112.68 | 3.16 | 47.17 |
| Ni 4 | 8.42 | 6.81 | 35.61 | | |
| Cr 5 | 6.81 | 6.39 | 103.01 | 3.33 | 45.9 |
| Ni 5 | 6.39 | 5.30 | 31.07 | | |

The overall layer thickness d derives from the sum of all $d_{Ln}$ $$d = \sum_{1}^{i=n} d_{Li} = \sum_{1}^{i=n} \rho_{Li}/R_{Li} = 48.44 \text{ nm}$$

Control Example:

In this example, the rate of one coating source (Ni) must be externally influenced in order to obtain the desired composition.

(a) A brief change occurs at the coating resistance Ni2, so that an actual value of 29.86Ω is suddenly measured instead of the required 36Ω. An overall resistance of 12.7 instead of 13.6Ω thus results. This means that the coating rate for Ni is elevated.

Table II now shows the course of regulation or control:

TABLE II

Overall resitance as a function of the number of applied Cr or Ni coatings, respectively.

| Coat | Overall Resistance given quadratic area in Ω before | after | Control Voltage in V | Actual Value Coating Resistance in Ω | $V_{Ln}$ | Momentary Mass % Cr |
|---|---|---|---|---|---|---|
| Cr 1 | — | 113.0 | 0 | 113.0 | 3.14 | 47.34 |
| Ni 1 | 113.0 | 27.3 | 0 | 36.0 | | |
| Cr 2 | 27.3 | 22.1 | 0 | 116.0 | 3.88 | 42.12 |
| Ni 2 | 22.1 | 12.7 | 0 | 29.86 | | |
| Cr 3 | 12.7 | 11.42 | 0 | 113.4 | 2.53 | 52.67 |
| Ni 3 | 11.42 | 9.1 | −0.9 | 44.79 | | |
| Cr 4 | 9.10 | 8.42 | 0 | 112.68 | 3.09 | 47.74 |
| Ni 4 | 8.42 | 6.84 | −0.1 | 36.45 | | |
| Cr 5 | 6.84 | 6.44 | 0 | 110.12 | 3.11 | 47.59 |
| Ni 5 | 6.44 | 5.45 | 0 | 35.45 | | |

The regulation or control now occurs such that the Cr continues with constant rate, whereas the power of the Ni source is reduced such that for Ni3, the coating resistance amounts to 44.79Ω and the overall resistance is again identical to the normal course (see for example Tables I and II). For Ni4, the power is then again boosted to such degree that the coating resistance amounts to 36Ω.

In accordance with FIG. 4, the interrelationship between the change of the sputter rate or of the coating resistance and a change of the power at the target (control voltage) is identified in preliminary tests for a speed of 1 rpm. The sputter rate for Ni given a power of 1000 W amounts to 4 nm/min. In order to achieve a coating thickness of 4.5 nm, a power of 1125 V is adjacent to the Ni target when the control voltage amounts to 0 V. This method has the advantage that both the concentration as well as the overall layer thickness have remained practically unaltered given an unaltered number of coatings.

(b) Control Method (b)

Given this method, one proceeds such that the ratio of the coating resistances $V_{Ln}=3.15$ or $1/V_{Ln}=0.317$ remains as constant as possible and the coating is continued until the desired final resistance has been reached.

In the described example, a constant change of the Ni power occurs beginning with the second coating (See Table III):

TABLE III

Overall Resistance as a Function of the Number of Applied Cr or Ni Coatings.

| Coat | Overall Resistance given quadrtic area in Ω before | after | Control Voltage in V | Actual Value Coating Resistance in Ω | $V_{Ln}$ or $1/V_{Ln}$ | Momentary Mass % Cr |
|---|---|---|---|---|---|---|
| Cr 1 | — | 113.0 | 0 | 113.0 | 3.14 | 47.34 |
| Ni 1 | 113.0 | 27.3 | 0 | 36.0 | 0.310 | 46.66 |
| Cr 2 | 27.3 | 22.1 | 0 | 116.0 | 3.96 | 41.61 |
| Ni 2 | 22.1 | 12.6 | 0 | 29.31 | | |
| Cr 3 | 12.6 | 11.10 | +1.1 | 93.0 | 3.19 | 46.94 |
| Ni 3 | 11.10 | 8.04 | 0 | 29.16 | 0.335 | 48.59 |
| Cr 4 | 8.04 | 7.23 | +1.1 | 87.02 | 2.98 | 48.63 |
| Ni 4 | 7.36 | 5.88 | 0 | 29.24 | | |

Due to the fact that the Cr target is matched to the elevated rate of the nickel source, the following layers are thicker, so that the coating can already be terminated at the fourth Cr and Ni coating since the desired final resistance of 5.5Ω has nearly been reached.

When the resistance material is doped with $O_2$ during the coating in order to increase the stability, then the specific electrical resistance of Cr and Ni is increased, whereby the rise of $\rho$ is higher for Cr than for Ni given the same partial oxygen pressure because Cr has a higher affinity to oxygen. After the specific electrical resistance for the doped Cr and Ni having the corresponding layer thickness has been identified again in preliminary tests, the monitoring and control of the composition could again occur as in the first example as long as the oxygen feed remains constant, this being monitored, for example, by means of a mass spectrometer. Should the oxygen feed nonetheless vary, which can also be perceived by the fact that both coating resistances simultaneously change in the same way, then the powers of the two coating sources remain constant and the partial oxygen pressure is regulated such that the required overall resistance is achieved again at the coating after the next.

Illustrative Embodiment 2

To be shown in this example is the regulation or control given variable concentration as a function of the layer thickness, as is required in the manufacture of diffusion barriers for metallizations of semiconductors given the deposition of solderable contacts or given interconnects that are resistant to electromigration. In the present instance, an Al layer is applied in which a tungsten layer is embedded in order to avoid electromigration given high current densities. The Al layer is deposited by means of sputtering an Al target in a magnetron dc process, whereas the tungsten is applied by means of radiofrequency diode sputtering.

The overall layer thickness should amount to about 1 μm, whereby a 100 nm thick W layer is to be embedded after 0.5 μm. In order to prevent diffusion effects, it is advantageous to allow the tungsten concentration to gradually rise or diminish.

Given the control voltage 0 V, the power at the Al target amounts to 8 kW, this corresponding to a rate of 96 nm/min.

Given the control voltage of 0 V, the power for tungsten lies at 5 kW, whereby a rate of 15 nm/min resulted. Given a rotational speed of 1 rpm, preliminary tests produced an $R_{LAl}=0.552Ω$ with $\rho_{Al}=5.3$ μΩcm or $R_{LW}=6.533Ω$ with $\rho_W=9.8$ μΩcm. The coating application parameters are shown in Table IV.

TABLE IV

Coating Resistance given Manufacture of an Al layer with a Tungsten Intermediate Layer.

| Coat | Coating Resistance given Quadratic are in Ω | $V_{LN} = R_{LW}/R_{LAl}$ | Control Voltage in V | Momentary Concentration in Mass % Al |
|---|---|---|---|---|
| Al 1 | 0.553 | — | 0 | 100 |
| W | — | — | −5 | |
| Al 2 | 0.552 | — | 0 | 100 |
| W | — | — | −5 | |
| Al 3 | 0.551 | — | 0 | 100 |
| W | — | — | −5 | |
| Al 4 | 0.551 | — | 0 | 100 |
| W 1 | 6.533 | 11.86 | 0 | 47.30 |
| Al 5 | 1.100 | 5.94 | −2.5 | 31.0 |
| W 2 | 6.532 | | 0 | |
| Al 6 | 2.201 | 2.97 | −3.75 | 18.20 |
| W 3 | 6.533 | | 0 | |
| Al 7 | 4.502 | 1.45 | −4.3 | 9.9 |
| W 4 | 6.533 | | 0 | |
| Al | — | — | −5 | |
| W 5 | 6.533 | | 0 | 0 |
| Al | — | — | −5 | |
| W 6 | 6.532 | | 0 | |
| Al | — | — | −5 | 0 |
| W 7 | 6.532 | | 0 | |
| Al | — | — | −5 | |
| W 8 | 6.533 | | 0 | 0 |
| Al | — | — | −5 | |
| W 9 | 6.534 | | 0 | |
| Al | — | — | −5 | 0 |
| W 10 | 6.533 | 1.45 | 0 | 9.9 |
| Al 8 | 4.503 | | −4.3 | |
| W 11 | 6.533 | | 0 | 18.3 |
| Al 9 | 2.200 | 2.97 | −3.75 | |
| W 12 | 6.534 | 5.93 | 0 | 30.98 |
| Al 20 | 1.102 | | −2.5 | |
| W 13 | 6.533 | 11.83 | 0 | 47.25 |
| Al 21 | 0.662 | | 0 | |
| W | — | — | −5 | 100 |
| Al 22 | 0.552 | — | 0 | |
| W | — | — | −5 | 100 |
| Al 23 | 0.553 | — | 0 | |
| W | — | — | −5 | 100 |
| Al 24 | 0.553 | — | 0 | |

Illustrative Embodiment 3

When one alloy component is very high-resistance (for example, Si), then a so-called pre-alloy which has a lower specific electrical resistance must be employed. In this case, the regulation occurs as in the first illustrative embodiment.

Given material combinations wherein the two components very easily diffuse into one another, one likewise obtains a discrete resistance decrease from coating to coating when the coating thickness is so low that the materials can completely diffuse into one another during one revolution.

In the present example, Ta-Si layers having an Si mass proportion of 24% are being produced. Both materials are sputtered in a dc magnetron process. Proceeding from an energy supply for both targets, the power is distributed via a variable resistance such that exactly the desired material combination arises given a control voltage of 0 V.

The resistance is measured before and after the tantalum deposition as well as after the silicon coating.

The problem in the manufacture of a Ta-Si layer having defined composition is that a variation of the resistance of a dual coating diffused into one another can have two causes:

1. Change of the power emission of the shared power supply of the two targets;
2. Change, for example, of the power division to the two targets given a constant power emission of the shared power supply.

In case 1, the regulation occurs such that given, for example, an increase of the resistance of a dual coating, a check is conducted to see whether the coating resistance of tantalum has also risen. When this is the case, then it is assumed at first that the power emission of the shared energy supply of the two targets has diminished. This can still be checked insofar as, given constant composition, the resistance of the dual coat is calculated for the correspondingly reduced layer thickness and this calculated value is compared to the measured resistance of the dual coating. When the difference is slight, only the power of the energy supply is increased via the first control voltage (analogous to illustrative embodiment 1) until the coating resistance of the tantalum has again reached its rated value. As a result of the coupling of the power division, the power at the Si also increases in a corresponding fashion so that the composition of the layer remains constant overall. The regulation occurs analogously when a reduction of the resistance of the dual coating is observed.

In case 2, a difference between the calculated resistance of the dual coating and the measured value occurs. This means that the specific electrical resistance of the dual coating and thus the composition of the alloy coating has changed even though the shared power supply outputs constant power.

Since the coupling of the power distribution via the variable resistance is such that, given a power increase, for example at the Si target, the power at the tantalum target automatically sinks, only the second control voltage must be varied such that for regulation or control the required tantalum coating resistance is re-established.

Regarding Case 1

In order to produce a TaSi$_2$ layer, the power or power division is set such that 5 nm tantalum and 11.2 nm Si are deposited per revolution. The specific electrical resistance of the tantalum coating ($\rho_{Ta}$=250 μΩcm) and of the Ta-Si dual coating ($\rho_{Ta-Si}$=280 μΩcm) are identified in preliminary tests. As a result of diffusion, the layer thickness of the Ta-Si dual coating does not amount to 16.2 nm, but to only 12.3 nm.

| Coat | Coating Resistance given quadratic area in Ω | Specific Electrical Resistance in μΩcm | Control Voltage 1 in V | Control Voltage 2 in V |
|---|---|---|---|---|
| Ta 1 | 500.8 | 250.4 | 0 | 0 |
| Ta—Si 1 | 227.6 | 280 | | |
| Ta 2 | 500.1 | 250.25 | 0 | 0 |
| Ta—Si 2 | 227.5 | 279.8 | | |
| Ta 3 | 600.3 | 249.7 | 0 | 0 |
| Ta—Si 3 | 274.5 | 280 | | |
| Ta 4 | 500.3 | 250.1 | +0.7 | 0 |
| Ta—Si 4 | 227.1 | 279.3 | | |
| Ta 5 | 500.9 | 250.4 | +0.7 | 0 |
| Ta—Si 5 | 228.0 | 280.4 | | |

Due to the fact that the required $\rho$ value derives for the dual coating, the reduction of the power occurring at the coating Ta 3 is recognized as a reduction in the shared energy supply. The energy supply is regulated such as by means of the control voltage 1 so that the desired coating resistance is again achieved.

Regarding Case 2

The coating conditions are identical to those in case 1. A change of the Ta rate is again identified at the coating Ta 3, this being recognized as a concentration change, i.e. as a change of the power division, on the basis of the elevated $\rho$ value of the dual coating Ta-Si 3. The rise of $\rho$ indicates an increase in the Si content and, due to the coupling of the targets, a decrease of the Ta content.

The power division is again regulated by means of the control voltage 2 such that the original coating resistances are obtained. A follow-up of the primary energy is not necessary in this case.

| Coat | Coating Resitance given quadratic area in Ω | Specific Electrical Resistance in μΩcm | Control Voltage 1 in V | Control Voltage 2 in V |
|---|---|---|---|---|
| Ta 1 | 500.1 | 250 | 0 | 0 |
| Ta—Si 1 | 227.0 | 279.2 | | |
| Ta 2 | 500.6 | 250.3 | 0 | 0 |
| Ta—Si 2 | 227.4 | 279.7 | | |
| Ta 3 | 573.2 | 249.9 | 0 | 0 |
| Ta—Si 3 | 237.2 | 311 | | |
| Ta 4 | 500.9 | 250.4 | 0 | −0.65 |
| Ta—Si 4 | 227.8 | 280.2 | | |
| Ta 5 | 500.7 | 250.3 | 0 | −0.65 |
| Ta—Si 5 | 227.1 | 279.3 | | |

Although various minor changes and modifications might be suggested by those skilled in the art, it will be understood that we wish to include within the claims of the patent warranted hereon all such changes and modifications as reasonably come within our contribution to the art.

We claim as our invention:

1. A method for monitoring and regulating composition and layer thickness of metallically conductive alloy layers AB during their manufacture as a multifilm sandwich formed of materials A and B by means of electrical resistance measurement, the individual alloy components A and B being cyclically deposited in coatings in chronological succession, comprising the steps of:
    (a) measuring a layer resistance of every layer of material A or B before and after the deposition and identifying at least one of the parameters coating resistance or ratio of coating resistance of layers A and B having a different material as an actual value;
    (b) comparing this actual value to at least one of the corresponding parameters coating resistance or ratio of coating resistances of layers A and B as determined before the layer production; and
    (c) given differences between the rated and actual values, varying coating rates of corresponding alloy component sources A and B until the actual values coincide with the rated values.

2. A method according to claim 1 including the step of executing actual value measurement given a coating thickness less than 150 nm.

3. A method according to claim 2 wherein the coating thickness is less than 50 nm.

4. A method according to claim 1 including the step of wirelessly transmitting the measured resistance actual values by means of a telemetry system in pulse code modulation.

5. A method according to claim 1 including the step of acquiring and calculating the actual measured values via a process control computer.

6. A method according to claim 1 including the step of manufacturing the alloy layers having a composition varying continuously over a thickness of the layer.

7. A method according to claim 1 including the step of manufacturing the alloy layers having a composition varying discontinuously over a thickness of the layer.

8. A method according to claim 1 including the step of manufacturing vapor-deposited alloy layers.

9. A method according to claim 1 including the step of manufacturing sputtered alloy layers.

10. A method according to claim 1 including the steps of manufacturing alloy layers of chrome-nickel, chrome-nickel-oxygen, tantalum-silicon, titanium-silicon, molybdenum-silicon, aluminum-silicon, chrome-silicon, and dual layers comprised of silicon-tantalum silicide, silicon-titanium silicide, silicon-molybdenum silicide, silicon-aluminum silicide, silicon-tungsten silicide, silicon-titanium with aluminum, silicon-copper with aluminum and chrome-silicon-oxygen layers.

11. A method for monitoring and regulating composition and layer thickness of metallically conductive alloy layers AB during their manufacture by means of electrical resistance measurement, the individual alloy components A and B being cyclically deposited in coatings in chronological succession, comprising the steps of:
    measuring a layer resistance of every layer A or B before and after the deposition and identifying at least one of the parameters coating resistance or ratio of coating resistances of layers A and B having different material; and
    based on said indentification of said at least one parameter coating resistance or ratio of coating resistances, varying coating rates of the alloy layers A and B.

* * * * *